United States Patent
Hwang

(10) Patent No.: US 10,298,868 B2
(45) Date of Patent: May 21, 2019

(54) IMAGE SENSING DEVICE AND METHOD FOR DRIVING THE SAME

(71) Applicant: SK hynix Inc., Gyeonggi-do (KR)

(72) Inventor: Won-Seok Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/417,364

(22) Filed: Jan. 27, 2017

(65) Prior Publication Data

US 2017/0339356 A1    Nov. 23, 2017

(30) Foreign Application Priority Data

May 18, 2016    (KR) .................... 10-2016-0060795

(51) Int. Cl.
  *H04N 5/369*    (2011.01)
  *H04N 5/378*    (2011.01)
  *H01L 27/146*   (2006.01)

(52) U.S. Cl.
  CPC ..... *H04N 5/3698* (2013.01); *H01L 27/14603* (2013.01); *H01L 27/14645* (2013.01); *H04N 5/378* (2013.01)

(58) Field of Classification Search
  CPC .................. H04N 5/3698; H04N 5/378; H01L 27/14603; H01L 27/14645
  See application file for complete search history.

(56) References Cited

U.S. PATENT DOCUMENTS

| | | | | |
|---|---|---|---|---|
| 7,649,392 B2* | 1/2010 | Tewinkle | ................. | H03K 5/04 327/170 |
| 9,083,368 B2* | 7/2015 | Kim | ..................... | H03M 1/0863 |
| 2009/0206899 A1* | 8/2009 | Tewinkle | ................. | H03K 5/04 327/170 |
| 2013/0032695 A1* | 2/2013 | Ishibashi | ................ | H04N 5/378 250/208.1 |
| 2014/0211061 A1* | 7/2014 | Nomiyama | .......... | H04N 5/3575 348/312 |
| 2015/0049232 A1* | 2/2015 | Kim | ........................ | H04N 5/378 348/308 |
| 2015/0189209 A1* | 7/2015 | Yang | ....................... | H04N 5/378 348/300 |
| 2017/0048475 A1* | 2/2017 | Sakuragi | ........... | H01L 27/14643 |

FOREIGN PATENT DOCUMENTS

KR    1020150125131    11/2015

\* cited by examiner

*Primary Examiner* — Nhan T Tran
(74) *Attorney, Agent, or Firm* — IP & T Group LLP

(57) ABSTRACT

An image sensing device includes: a pixel array suitable for generating a plurality of pixel signals corresponding to incident light; a comparison block suitable for comparing the pixel signals with a ramp signal to generate a plurality of comparison signals; a logic block suitable for adjusting slew rates of the respective comparison signals to generate a plurality of logic signals; a global count block suitable for generating a global count signal; and a storing block suitable for storing counted values of the global count signal based on the logic signals received from the logic block.

13 Claims, 11 Drawing Sheets

IMAGE SENSING DEVICE AND METHOD FOR DRIVING THE SAME

CROSS-REFERENCE TO RELATED APPLICATIONS

The present application claims priority from Korean Patent Application No. 10-2016-0060795, filed on May 18, 2016, which is incorporated herein by reference in its entirety.

BACKGROUND

1. Field

Exemplary embodiments of the present invention relate to a design technology of an integrated circuit, and more particularly, to an image sensing device and a method for driving the same.

2. Description of the Related Art

Image sensing devices capture images using photosensitive properties of semiconductors. Image sensing devices are often classified into charge-coupled device (CD image sensors and complementary metal-oxide semiconductor (CMOS) image sensors, CMOS image sensors allow both analog and digital control circuits to be integrated in a single integrated circuit (IC), making CMOS image sensors the most widely used type of image sensor.

FIG. 1 is a block diagram illustrating a conventional image sensing device 100.

Referring to FIG. 1, the conventional image sensing device 100 includes a pixel array 110, a ramp block 120, a global count block 130, a comparison block 140, and a storing block 150.

The pixel array 110 includes a plurality of pixels PXs arranged in row and column directions. For example, the pixel array 110 includes N*Y pixels PXs, where 'N' is the number of columns, and 'Y' is the number of rows. The pixel array 110 generates first to $N^{th}$ pixel signals VPX<1:N> by rows for each unit row time.

The ramp block 120 generates a ramp signal VRAMP, which is common and has a predetermined wave form, for each unit row time in response to a ramp control signal RP.

The global count block 130 generates a count signal (i.e., a global count signal) CNT<1:M> that are counted in a predetermined manner for each unit row time.

The comparison block 140 compares the first to $N^{th}$ pixel signals VPX<1:N> with the ramp signal VRAMP to generate first to $N^{th}$ comparison signals VAMP<1:N>. For example, the comparison block 140 includes first to $N^{th}$ comparison sections AMP1 to AMPN for comparing the respective pixel signals VPX<1:N> with the ramp signal VRAMP.

The storing block 150 stores the corresponding count signal CNT<1:M> by columns based on the first to $N^{th}$ comparison signals VAMP<1:N>. For example, the storing block 150 includes first to Nth storing sections LAT1 to LATN for storing the corresponding count signal CNT<1:M> based on the first to $N^{th}$ comparison signals VAMP<1:N>, respectively.

FIG. 2 is a detailed diagram of the comparison block 140 and the storing block 150 shown in FIG. 1. FIG. 2 representatively shows the first comparison section AMP1 among the first to $N^{th}$ comparison sections AMP1 to AMPN included in the comparison block 140, and the first storing section LAT1 among the first to Nth storing sections LAT1 to LATN included in the storing block 150.

Referring to FIG. 2, the first comparison section AMP1 compares the first pixel signal VPX<1> with the ramp signal VRAMP to generate the first comparison signal VAMP<1>. For example, the first comparison section AMP1 includes a first differential amplification unit AMP1_1 and a first output unit AMP1_3. The first differential amplification unit AMP1_1 amplifies a voltage difference between the first pixel signal VPX<1> and the ramp signal VRAMP to generate a first amplification signal VS<1>. The first differential amplification unit AMP1_1 uses a first power source voltage VDD or a second power source voltage VDDA as a source voltage. The first output unit AMP1_3 outputs the first amplification signal VS<1> as the first comparison signal VAMP<1>. The first output unit AMP1_3 uses the first power source voltage VDD.

The first storing section LAT1 stores the common count signals CNT<1:M> based on the first comparison signal VAMP<1>. For example, the first storing section LAT1 includes a first latch control unit LAT1_1 and a first latch unit LAT1_3. The first latch control unit LAT1_1 generates a first latch control signal (i.e., a one-shot pulse) ONE_SHOT<1> based on the first comparison signal VAMP<1>. The first latch unit LAT1_3 latches the count signal CNT<1:M> based on the first latch control signal ONE_SHOT<1>.

FIG. 3 is a timing diagram illustrating an operation of the conventional image sensing device 100. It should be noted that FIG. 3 shows only an operation related to the first pixel signal VPX<1>.

Referring to FIG. 3 the pixel array 110 generates the first pixel signal VPX<1> corresponding to incident light during a unit row time SRT. For example, the pixel array 110 generates a first reset signal VRST<1>, corresponding to a noise component reflected in the first pixel signal VPX<1>, as the first pixel signal VPX<1> during a reset time RT of the unit row time SRT, and then generate a first data signal VDT<1>, corresponding to the incident light, as the first pixel signal VPX<1> during a data time DT of the unit row time SRT.

The ramp block 120 generates the ramp signal VRAMP having a predetermined wave form during the unit row time SRT. For example, the ramp signal VRAMP ramps down within a range of a reset voltage during the reset time RT, and ramps down within a range of a data voltage during the data time DT.

The global count block 130 generates the count signal CNT<1:M> during the unit row time SRT. For example, the count signal CNT<1:M> may be counted up during the reset time RT and counted up during the data time DT, respectively.

The first comparison section AMP1 compares the first pixel signal VPX<1> with the ramp signal VRAMP to generate the first comparison signal VAMP<1>. For example, the first comparison section AMP1 generates the first comparison signal VAMP<1> having a high logic level when a voltage level of the ramp signal VRAMP is higher than a voltage level of the first pixel signal VPX<1> and generate the first comparison signal VAMP<1> having a low logic level when the voltage level of the ramp signal VRAMP is lower than the voltage level of the first pixel signal VPX<1>.

The first storing section LAT1 stores the count signal CNT<1:M> in response to the first comparison signal VAMP<1>. For example, the first storing section LAT1 activates the first latch control signal ONE_SHOT<1> when the first comparison signal VAMP<1> transitions from a high logic level to a low logic level, and latches the count signal CNT<1:M> when the first latch control signal ONE_SHOT<1> is triggered (i.e., pulsed).

However, the conventional image sensing device 100 has the following concerns.

FIG. 4 is a timing diagram illustrating the concerns of the conventional image sensing device 100 shown in FIG. 1.

Referring to FIG. 4, the first storing section LAT1 activates the first latch control signal ONE_SHOT<1> when the first comparison signal VAMP<1> is deactivated. That is, a deactivation timing of the first comparison signal VAMP<1> determines a decision timing D1 for a count value. The first storing section LAT1, latches the count signal CNT<1:M> corresponding to the decision timing D1 of the first latch control signal ONE_SHOT<1> when the first latch control signal ONE_SHOT<1> is activated. In other words, the first storing section LAT1 operates according to the decision timing D1 of the first comparison signal VAMP<1>. Since the first storing section LAT1 uses the first power source voltage VDD, a voltage level of the first power source voltage VDD may drop when the first storing section LAT1 operates. When more comparison signals transition at the same decision timing as the decision timing D1 of the first comparison signal VAMP<1> among the first to $N^{th}$ comparison signals VAMP<1:N>, the voltage level of the first power source voltage VDD increasingly drops. The drop of the voltage level of the first power source voltage VDD may influence other circuits using the first power source voltage VDD.

For example, when a $K^{th}$ comparison signal VAMP<K> transitions at a decision timing DK around the decision timing D1 of the first comparison signal VAMP<1>, the decision timing DK for the $K^{th}$ comparison signal VAMP<K> may be delayed more than an expected timing. This is because a $K^{th}$ comparison section AMPK uses the dropped first power source voltage VDD for generating the $K^{th}$ comparison signal VAMP<K>. In this case, a $K^{th}$ storing section LATK may latch errored count signal CNT<1:M> because the $K^{th}$ storing section LATK operates based on the $K^{th}$ comparison signal VAMP<K> whose decision timing DK is unintentionally delayed.

When incident light of a first pixel and incident light of a $K^{th}$ pixel arranged in the same row are similar, the decision timing D1, of the first comparison signal VAMP<1> and the decision timing DK of the $K^{th}$ comparison signal VAMP<K> may be adjacent in time to each other. Further, when the incident light of the first pixel and the incident light of the $K^{th}$ pixel are the same, the decision timing D1 of the first comparison signal VAMP<1> and the decision timing DK of the $K^{th}$ comparison signal VAMP<K> are expected to be the same, but may be different due to a difference in the circuit performance, etc.

SUMMARY

Exemplary embodiments of the present invention are directed to an image sensing device that is less sensitive to a dropped power source.

In accordance with an embodiment of the present invention, an image sensing device includes: a pixel array suitable for generating a plurality of pixel signals corresponding to incident light; a comparison block suitable for comparing the pixel signals with a ramp signal to generate a plurality of comparison signals; a logic block suitable for adjusting slew rates of the respective comparison signals to generate a plurality of logic signals; a global count block suitable for generating a global count signal; and a storing block suitable for storing counted values of the global count signal based on the logic signals received from the logic block.

The comparison block and the storing block may use the same source voltage.

The logic block may delay deactivation edges of the comparison signals.

The logic block may include a plurality of logic sections each including: a first logic unit suitable for delaying a corresponding comparison signal to generate a corresponding delayed signal; and a second logic unit suitable for performing a logic operation on the corresponding comparison signal and the corresponding delayed signal to generate a corresponding logic signal.

The storing block may include a plurality of logic sections each including: a latch control unit suitable for generating a corresponding latch control signal based on a corresponding logic signal; and a latch unit suitable for latching a corresponding count signal based on, the corresponding latch control signal.

At least two of the pixel signals may have a voltage level corresponding to the same incident light during a unit row time.

At least two of the pixel signals may have a voltage level that falls within the same color range during a unit row time.

In accordance with another embodiment of the present invention, an image sensing device includes: a pixel array suitable for generating a plurality of pixel signals corresponding to incident light; a plurality of comparison block suitable for comparing the pixel signals with a ramp signal to generate a plurality of comparison signals; a logic block including a plurality of logic section groups each suitable for delaying comparison signals corresponding to the respective logic section groups by delay times that are differently set by groups to generate a plurality of logic signals; a global count block suitable for generating a global count signal; and a plurality of storing block suitable for storing counted values of the global count signal based on the logic signals received from the logic block.

The comparison block and the storing block may use the same source voltage.

The logic block may delay a deactivation edge of the comparison signals by delay times that are differently set by logic section groups.

The storing block may include: a plurality of latch control units suitable for generating a plurality of lath control signals based on the logic signals; and a plurality of latch units suitable for latching the count signals based on the latch control signals.

At least two of pixel signals may have a voltage level corresponding to the same incident light during a unit row time.

At least two of the pixel signals may have a voltage level that falls within the same color range during a unit row time.

In accordance with another embodiment of the present invention, a method for driving an image sensing device includes: generating a plurality of comparison signals driven to have a first slew rate, based on plurality of pixel signals and a ramp signal; generating a plurality of logic signals driven to have a second slew rate based on the comparison signals; generating a global count signal; and storing counted values of the global count signal based on the logic signals.

The generating of the comparison signals and the storing of counted values of the global count signal may be carried out using the same source voltage.

The generating of the logic signals may include delaying deactivation edges of the comparison signals to generate the logic signals.

The generating of the logic signals may include: generating a plurality of delayed signals by delaying each of the comparison signals by the same delay time; and generating the logic signals by performing a logic operation on each of the comparison signals and delayed signals.

The generating of the logic signals may include: generating a plurality of delayed signals by delaying the comparison signals by delay times that are differently set by groups; and generating the logic signals by performing a logic operation on each of the comparison signals and delayed signals.

At least two of the pixel signals may have a voltage level corresponding to the same incident light during a unit row time.

At least two of the pixel signals may have a voltage level that falls within the same color range during a unit row time.

DETAILED DESCRIPTION

Figure 1:
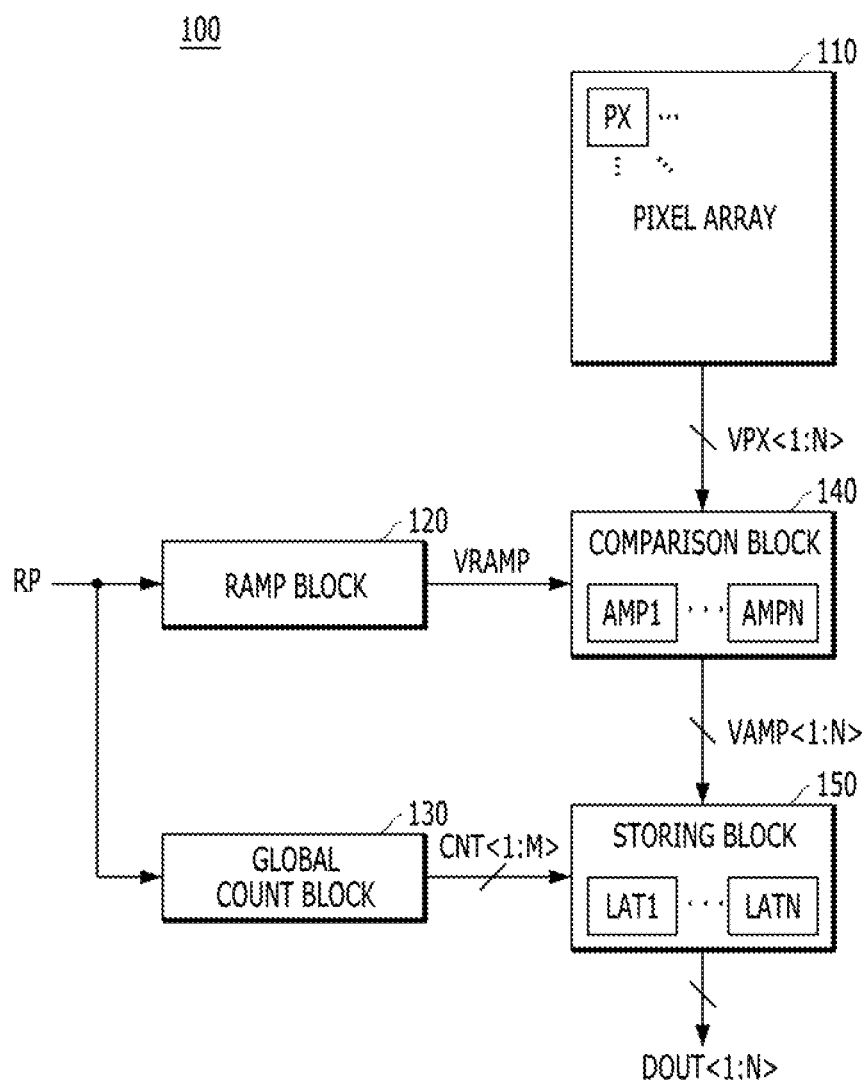
FIG. 1 is a block diagram illustrating a conventional image sensing device.
Figure 2:
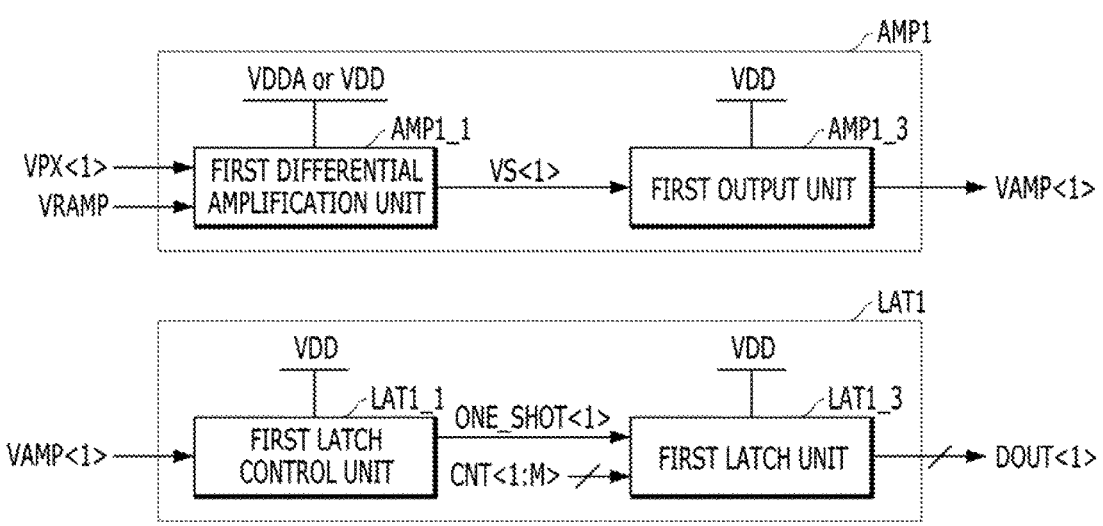
FIG. 2 is a detailed diagram of a first comparison block and a first storing block shown in FIG. 1.
Figure 3:
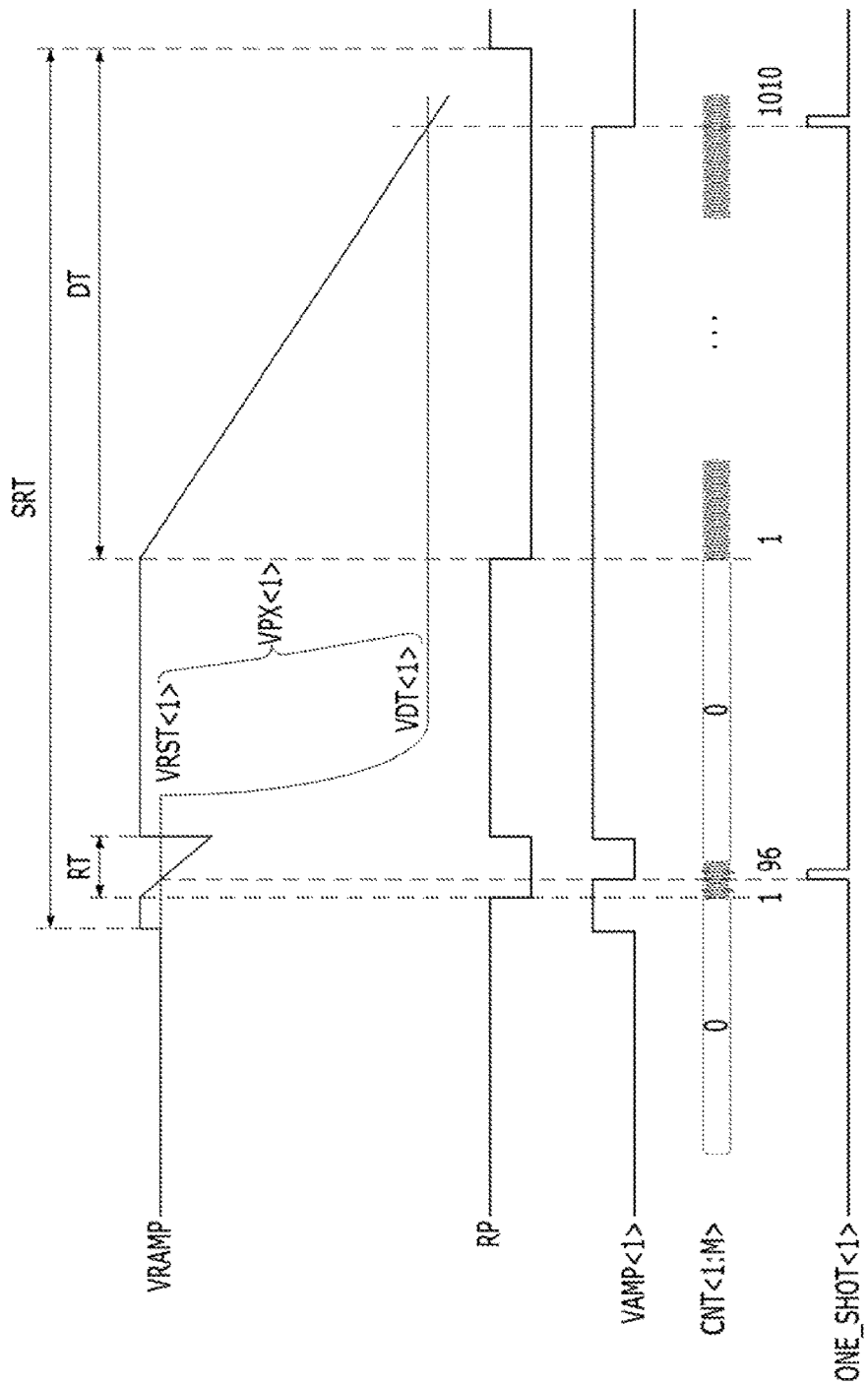
FIG. 3 is a timing diagram illustrating an operation of the conventional image sensing device shown in FIG. 1.
Figure 4:
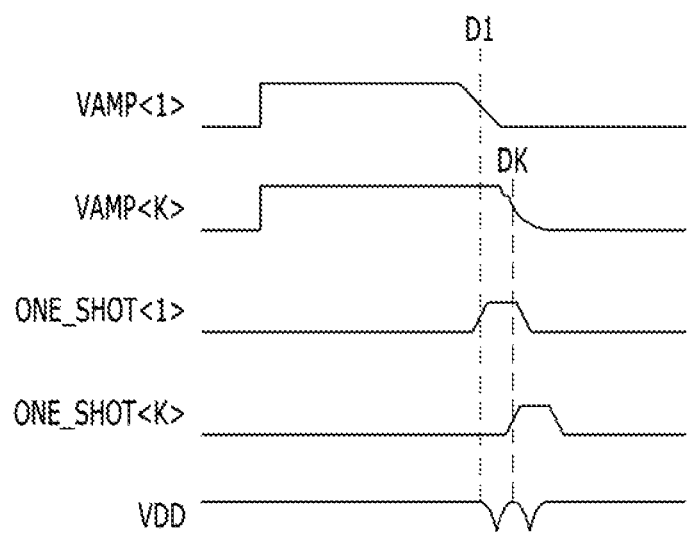
FIG. 4 is a timing diagram illustrating concerns of the conventional image sensing device shown in FIG. 1.

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention. As used herein, singular forms are intended to include the plural forms as well, unless the context clearly indicates otherwise. Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Figure 5:
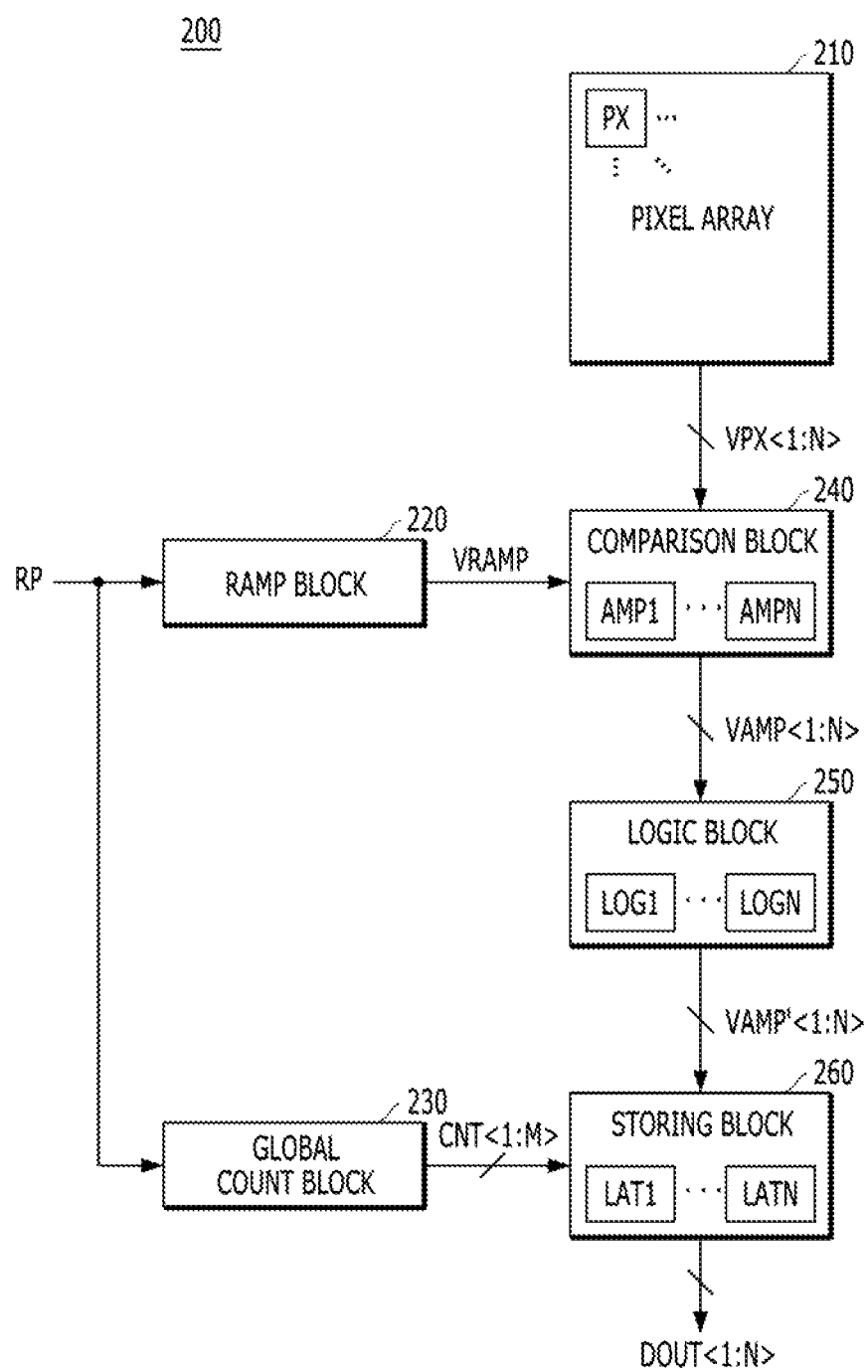
FIG. 5 is a block diagram illustrating an image sensing device according to an embodiment of the present invention.

Referring now to FIG. 5, an image sensing device 200 is provided, according to an embodiment of the present invention.

The image sensing device 200 may include a pixel array 210, a ramp block 220, a global count block 230, a comparison block 240, a logic block 250, and a storing block 260.

The pixel array 210 may include a plurality of pixels PXs arranged in rows and columns. For example, the pixel array 210 may include N*Y pixels PXs, where 'N' is the number of columns, and 'Y' is the number of rows. The pixel array 210 may generate first to $N^{th}$ pixel signals VPX<1:N> for each row at a time.

The ramp block 220 may generate a ramp signal VRAMP having a predetermined wave form, in response to a ramp control signal RP. The ramp signal VRAMP is applied in common to all pixels in a row at a time.

The global count block 230 may generate a common count signal (i.e., a global count signal) CNT<1:M> counted in a predetermined manner for each unit row time. For example, the count signal CNT<1:M> may be counted up in response to the ramp control signal RP denoting a ramp-down of the ramp signal VRAMP. Further, a value of the count signal CNT<1:M>, corresponding to each column, may be determined by triggering a one-shot pulse.

The comparison block 240 may compare each of the first to $N^{th}$ pixel signals VPX<1:N> (for example from the N pixels of row 1) with the ramp signal VRAMP to generate first to $N^{th}$ comparison signals VAMP<1:N>. Each of the first to $N^{th}$ comparison signals VAMP<1:N> may be driven to have a first slew rate. The comparison block 240 may include first to $N^{th}$ comparison sections AMP1 to AMPN corresponding to the N columns of the pixel array for comparing each of the pixel signals VPX<1:N> from each row with the ramp signal VRAMP.

The logic block 250 may adjust a slew rate of the respective comparison signals VAMP<1:N> to generate first to $N^{th}$ logic signals VAMP'<1:N>. For example, the logic block 250 may adjust the slew rate of a deactivation edge (e.g. a falling edge) of the respective comparison signals VAMP<1:N>. Each of the first to $N^{th}$ logic signals VAMP'<1:N> may be driven to have a second slew rate that is greater than the first slew rate. Further, the logic block 250 may delay the deactivation edge of the respective comparison signals VAMP<1:N> by a predetermined delay time to generate the first to $N^{th}$ logic signals VAMP'<1:N>. The logic block 250 may include first to $N^{th}$ logic sections LOG1 to LOGN corresponding to the respective comparison signals VAMP<1:N>.

The storing block 260 may store the corresponding count signal CNT<1:M> by columns based on the first to $N^{th}$ logic signals VAMP'<1:N>. The storing block 260 may include first to Nth storing sections LAT1 to LATN each storing the count signal CNT<1:M> for a corresponding column based on the first to $N^{th}$ logic signals VAMP'<1:N>.

Figure 6:
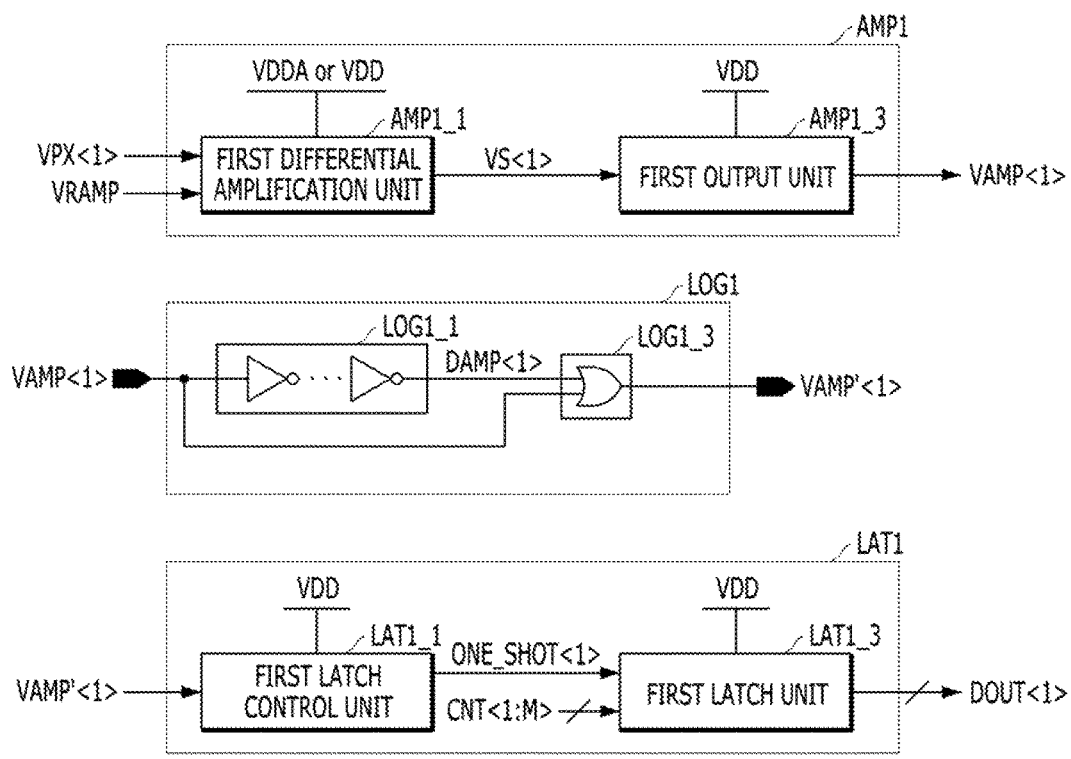
FIG. 6 is a detailed diagram illustrating a first comparison section, a first logic section and a first storing section shown in FIG. 5.

FIG. 6 is a detailed diagram of the comparison block 240 the logic block 250 and the storing block 260 shown in FIG. 5. FIG. 6 representatively shows the first comparison section AMP1 among the first to $N^{th}$ comparison sections AMP1 to AMPN included in the comparison block 240, the first logic section LOG1 among the first to $N^{th}$ logic sections LOG1 to LOGN included in the logic block 250, and the first storing section LAT1 among the first to Nth storing sections LAT1 to LATN included in the storing block 260.

Referring to FIG. 6, the first comparison section AMP1 may compare the first pixel signal VPX<1> with the ramp signal VRAMP to generate the first comparison signal VAMP<1>. For example, the first comparison section AMP1 may include a first differential amplification unit AMP1_1 and a first output unit AMP1_3. The first differential amplification unit AMP1_1 may amplify a voltage difference between the first pixel signal VPX<1> and the ramp signal VRAMP to generate a first amplification signal VS<1>. The first differential amplification unit AMP1_1 may use a first power source voltage VDD or a second power source voltage VDDA as a source voltage. The first output unit AMP1_3 may output the first amplification signal VS<1> as the first comparison signal VAMP<1>. The first output unit AMP1_3 may use the first power source voltage VDD as the source voltage.

The first logic section LOG1 may generate the first logic signal VAMP'<1> in response to the first comparison signal VAMP<1>. For example, the first logic section LOG1 may include a delay unit LOG1_1 and a logic operation unit LOG1_3. The delay unit LOG1_1 may delay the first comparison signal VAMP<1> to generate a first delayed signal DAMP<1>. For example, the delay unit LOG1_1 may include an inverter chain having even number of inverters. The logic operation unit LOG1_3 may perform a logic operation on the first comparison signal VAMP<1> and the first delayed signal DAMP<1> to generate the first logic signal VAMP'<1>. For example, the logic operation unit LOG1_3 may include an OR gate.

The first storing section LAT1 may store the count signal CNT<1:M> based on the first logic signal VAMP'<1>. For example, the first storing section LAT1 may include a first latch control unit LAT1_1 and a first latch unit LAT1_3. The first latch control unit LAT1_1 may generate a first latch control signal (i.e., a one-shot pulse) ONE_SHOT<1> based on the first logic signal VAMP'<1>. The first latch unit LAT1_3 may latch the count signal CNT<1:M> based on the first latch control signal ONE_SHOT<1>. The first latch control unit LAT1_1 and the first latch unit LAT1_3 may use the first power source voltage VDD as the source voltage.

Hereinafter, an operation of the image sensing device 200 having the aforementioned structure is described with reference to FIGS. 7 and 8.

Figure 7:
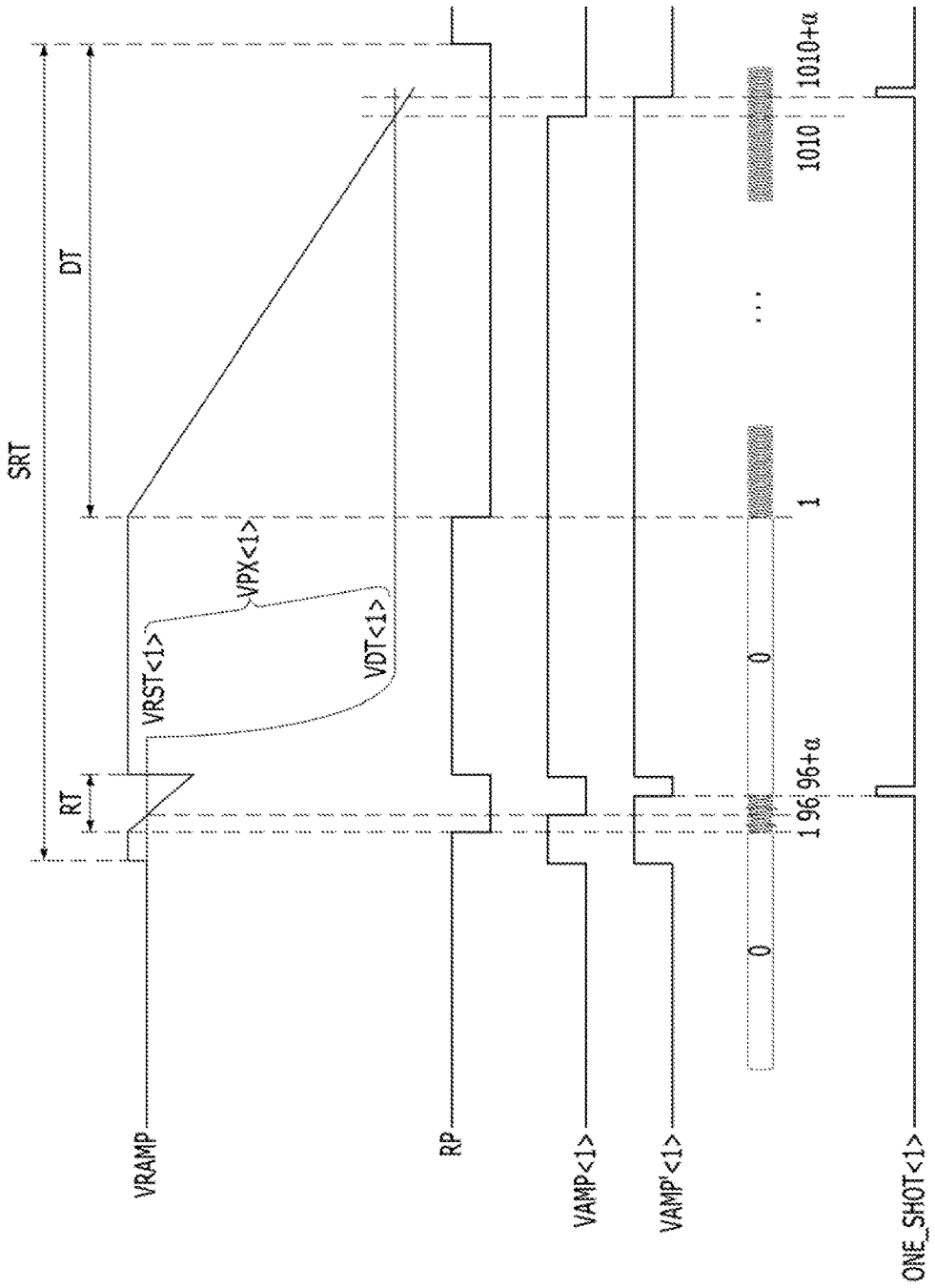
FIGS. 7 and 8 are timing diagrams illustrating an operation of the image sensing device shown in FIG. 5.

FIG. 7 shows an operation corresponding to the first pixel signal VPX<1>.

Referring to FIG. 7, the pixel array 210 may generate the first pixel signal VPX<1> during a unit row time SRT. For example, the pixel array 210 may generate a first reset signal VRST<1>, corresponding to a noise component reflected in the first pixel signal VPX<1>, as the first pixel signal VPX<1> during a reset time RT of the unit row time SRT, and then may generate a first data signal VDT<1>, corresponding to incident light, as the first pixel signal VPX<1> during a data time DT of the unit row time SRT.

The ramp block 220 may generate the ramp signal VRAMP having a predetermined wave form during the unit row time SRT based on the ramp control signal RP. For example, the ramp signal VRAMP may ramp down within a range of a reset voltage during the reset time RT, and may ramp down within a range of a data voltage during the data time DT.

The global count block 230 may generate the count signal CNT<1:M> during the unit row time SRT. For example, the count signal CNT<1:M> may be counted up during the reset time RT and counted up during the data time DT, respectively.

The first comparison section AMP1 may compare the first pixel signal VPX<1> with the ramp signal VRAMP to generate the first comparison signal VAMP<1>. For example, the first comparison section AMP1 may generate the first comparison signal VAMP<1> having a high logic level when a voltage level of the ramp signal VRAMP is higher than a voltage level of the first pixel signal VPX<1> and generate the first comparison signal VAMP<1> having a low logic level when the voltage level of the ramp signal VRAMP is lower than the voltage level of the first pixel signal VPX<1>.

The first logic section LOG1 may delay the first comparison signal VAMP<1> by a predetermined delay time DLY (refer to FIG. 8) to generate the first logic signal VAMP'<1>. For example, the first logic section LOG1 may delay a deactivation edge (e.g., a falling edge) of the first comparison signal VAMP<1> by the delay time DLY to generate the first logic signal VAMP'<1>.

The first storing section LAT1 may store the count signal CNT<1:M> in response to the first logic signal VAMP'<1>. For example, the first storing section LAT1 may activate the first latch control signal ONE_SHOT<1> when the first logic signal VAMP'<1> transitions from a high logic level to a low logic level, and may latch the count signal CNT<1:M> corresponding to the first reset signal VRST<1>, and then may latch the count signal CNT<1:M> corresponding to the first data signal VDT<1>, when the first latch control signal ONE_SHOT<1> is triggered (i.e., pulsed).

The count signal CNT<1:M> corresponding to the first reset signal VRST<1> may include a count code α corresponding to the delay time DLY, and the count signal CNT<1:M> corresponding to the first data signal VDT<1> may also include the count code α corresponding to the delay time DLY. In other words, the count code α may be unintentionally reflected into the count signal CNT<1:M> corresponding to the first reset signal VRST<1> and the count signal CNT<1:M> corresponding to the first data signal VDT<1>. Although not illustrated, the count code α may be offset through a subsequent operation, for example, a digital double sampling (DDS) operation.

Although not illustrated, the pixel array 210 may simultaneously generate the second to $N^{th}$ pixel signals VPX<2:N> together with the first pixel signal VPX<1> during the unit row time SRT. Each of the second to $N^{th}$ pixel signals VPX<2:N> may have a voltage level corresponding to incident light. When a pixel signal having a voltage level that is similar to a voltage level of the first pixel signal VPX<1> among the second to Nth pixel signals VPX<2:N> is referred to as a $K^{th}$ pixel signal VPX<K>, the first pixel signal VPX<1> and the $K^{th}$ pixel signal VPX<K> may have voltage levels corresponding to the same or similar incident light. In this case, a decision timing (hereinafter referred to as a "first decision timing D1") of the first comparison signal VAMP<1> corresponding to the first pixel signal VPX<1> and a decision timing (hereinafter referred to as a "$K^{th}$ decision timing DK") of the $K^{th}$ comparison signal VAMP<K> corresponding to the $K^{th}$ pixel signal VPX<K> may be adjacent in time to each other. Detailed descriptions thereof are made by reference to FIG. 8.

Figure 8:
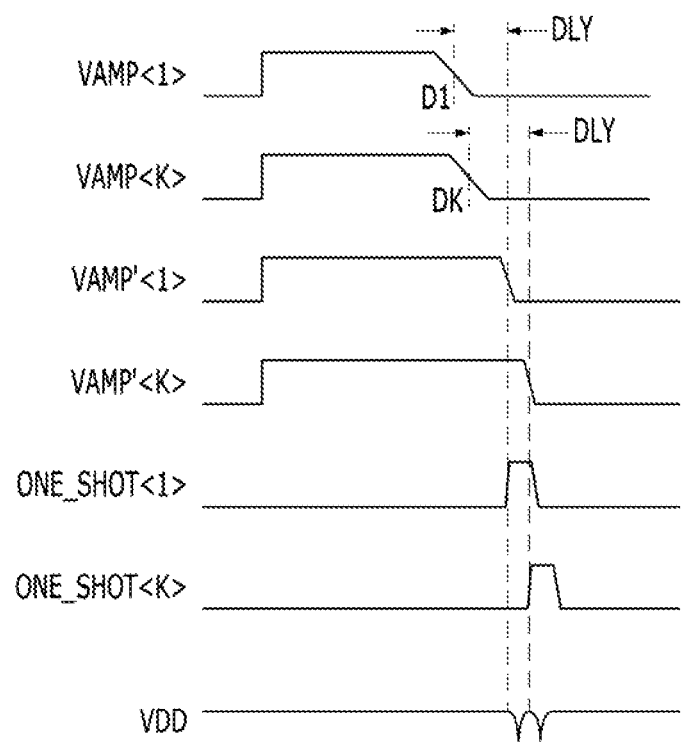

Referring to FIG. 8, the first comparison section AMP1 may generate the first comparison signal VAMP<1> that is deactivated corresponding to the first decision timing D1. The deactivation edge of the first comparison signal VAMP<1> may be driven to have the first slew rate. The first slew rate may be determined by the first differential amplification unit AMP1_1 included in the first comparison section AMP1. The first differential amplification unit AMP1_1 may be an analog circuit, and the first slew rate may be determined depending on an operational characteristic of the first differential amplification unit AMP1_1.

The first logic section LOG1 may generate the first logic signal VAMP'<1> that is deactivated after the delay time DLY passes from the first decision timing D1. A deactivation edge of the first logic signal VAMP'<1> may be driven to have the second slew rate that is greater than the first slew rate. The first logic section LOG1 may be a digital circuit, and the second slew rate may be determined depending on an operational characteristic of the first logic section LOG1.

The first storing section LAT1 may generate the first latch control signal ONE_SHOT<1> corresponding to the decision timing of the first logic signal VAMP'<1> and latch the count signal CNT<1:M> in response to the first latch control signal ONE_SHOT<1>. While the first storing section LAT1 operates, the voltage level of the power source voltage VDD that is used in the first storing section LAT1 as the source voltage may drop. The dropped power source voltage VDD may not influence the first comparison signal VAMP<1> and the $K^{th}$ comparison signal VAMP<K> due to the different operation timings there between.

The $K^{th}$ comparison section AMPK may generate the $K^{th}$ comparison signal VAMP<K> that is deactivated corresponding to the $K^{th}$ decision timing DK around the first decision timing D1. A deactivation edge of the $K^{th}$ comparison signal VAMP<K> may be driven to have the first slew rate. The first slew rate may be determined by a $K^{th}$ differential amplification unit AMPK_1 included in the $K^{th}$ comparison section AMPK. The $K^{th}$ differential amplification unit AMPK_1 may be an analog circuit, and the first slew rate may be determined depending on an operational characteristic of the $K^{th}$ differential amplification unit AMPK_1. When the first decision timing D1 and the $K^{th}$ decision timing DK are adjacent in time to each other, a code value of the count signal CNT<1:M> corresponding to the first comparison signal VAMP<1> and a code value of the count signal CNT<1:M> corresponding to the $K^{th}$ comparison signal VAMP<K> may be included within the same color range. For example, when the first pixel signal VPX<1> and the $K^{th}$ pixel signal VPX<K> have a voltage level corresponding to similar incident light, the first decision timing D1 and the $K^{th}$ decision timing DK may be adjacent in time to each other. Further, when the first pixel signal VPX<1> and the $K^{th}$ pixel signal VPX<K> have a voltage level corresponding to the same incident light, the first decision timing D1 and the $K^{th}$ decision timing DK are expected to be the same, but may be merely adjacent in time to each other due to a difference in the circuit performance, etc.

A $K^{th}$ logic section LOGK may generate a $K^{th}$ logic signal VAMP'<K> that is deactivated after the delay time DLY passes from the $K^{th}$ decision timing DK. A deactivation edge of the $K^{th}$ logic signal VAMP'<K> may be driven to have the second slew rate that is greater than the first slew rate. The $K^{th}$ logic section LOGK may be a digital circuit, and the second slew rate may be determined depending on an operational characteristic of the $K^{th}$ logic section LOGK. Since the $K^{th}$ logic section LOGK uses the power source voltage VDD as the source voltage, the $K^{th}$ logic section LOGK may be influenced by the dropped power source voltage VDD. However, since the $K^{th}$ logic section LOGK generates the $K^{th}$ logic signal VAMP'<K> having the second slew rate, a possibility that the $K^{th}$ logic section LOGK is influenced by the dropped power source voltage VDD may be minimized. In other words since the deactivation edge of the $K^{th}$ logic signal VAMP'<K> is driven to have the second slew rate, a probability that the decision timing of the $K^{th}$ logic signal VAMP'<K> falls within a range where the voltage level of the power source voltage VDD drops may be remarkably low. Although the decision timing of the $K^{th}$ logic signal VAMP'<K> falls within the range, the decision timing of the $K^{th}$ logic signal VAMP'<K> may not change since the $K^{th}$ logic section LOGK is driven to have the second slew rate that is relatively great.

A $K^{th}$ storing section LATK may generate a $K^{th}$ latch control signal ONE_SHOT<K> corresponding to the decision timing of the $K^{th}$ logic signal VAMP'<K>, and normally latch the count signal CNT<1:M> in response to the $K^{th}$ latch control signal ONE_SHOT<K>. Although the voltage level of the power source voltage VDD may drop due to an operation of the $K^{th}$ storing section LATK, the subsequently operated latch section may be minimally influenced by the dropped power source voltage VDD through the aforementioned operation process.

In accordance with an embodiment of the present invention, an influence on an output operation of a comparison block may be removed through a delay control, and an influence on a latch operation of a storing block may be minimized through a logic operation process.

Figure 9:
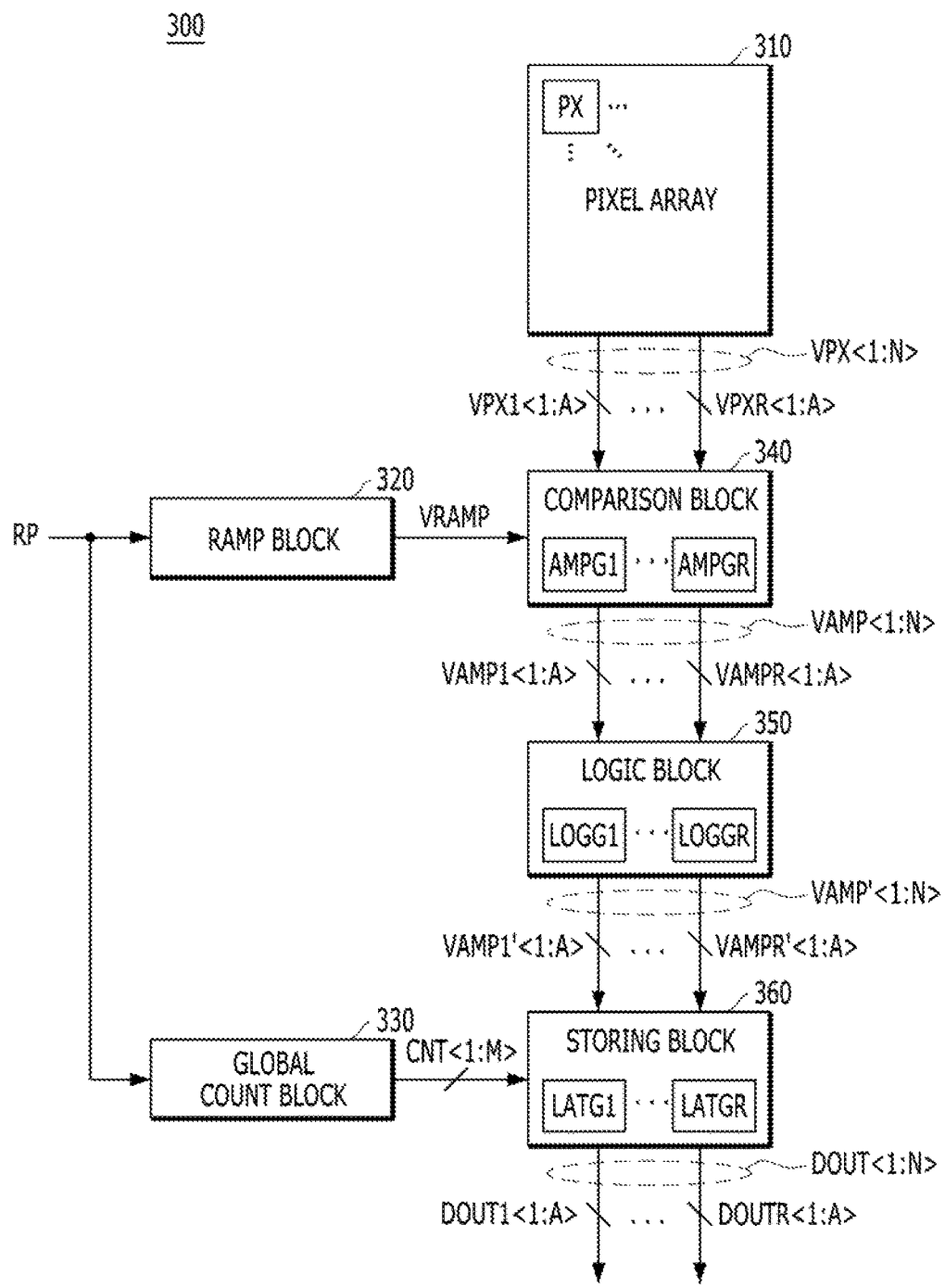
FIG. 9 is a block diagram illustrating an image sensing device according to an embodiment of the present invention.

FIG. 9 is a block diagram illustrating an image sensing device 300 according to an embodiment of the present invention.

Referring now to FIG. 9, the image sensing device 300 may include a pixel array 310, a ramp block 320, a global count block 330, a comparison block 340, a logic block 350, and a storing block 360.

Since the pixel array 310, the ramp block 320, the global count block 330, the comparison block 340, and the storing block 360 may have substantially the same structure as the pixel array 210, the ramp block 220, the global count block 230, the comparison block 240, and the storing block 260, detailed descriptions thereof will be omitted.

The comparison block 340 may include first to $R^{th}$ comparison section groups AMPG1 to AMPGR. Each of the first to $R^{th}$ comparison section groups AMPG1 to AMPGR may include at least two of the first to $N^{th}$ comparison sections AMP1 to AMPN described above. Hereinafter, pixel signals inputted to each of the first to $R^{th}$ comparison section groups AMPG1 to AMPGR are referred to as first to $R^{th}$ pixel group signals VPX1<1:A> to VPXR<1:A>, and comparison signals outputted from each of the first to $R^{th}$ comparison section groups AMPG1 to AMPGR are referred to as first to $R^{th}$ comparison group signals VAMP1<1:A> to VAMPR<1:A>. The storing block 360 may include first to $R^{th}$ storing section groups LATG1 to LATGR. Each of the first to $R^{th}$ storing section groups LATG1 to LATGR may include at least two of the first to $N^{th}$ storing sections LAT1 to LATN described above. Hereinafter logic signals inputted to each of the first to $R^{th}$ storing section groups LATG1 to LATGR are referred to as first to $R^{th}$ logic group signals VAMP1'<1:A> to VAMPR'<1:A>, and digital signals outputted from each of the first to $R^{th}$ storing section groups LATG1 to LATGR are referred to as first to $R^{th}$ digital group signals DOUT1<1:A> to DOUTR<1:A>. For reference, 'R' denotes the number of the groups, and 'A' denotes the number of columns included in a single group. Further, 'R*A' equals to 'N'.

The logic block 350 may include first to $R^{th}$ logic section groups LOGG1 to LOGGR. Each of the first to $R^{th}$ logic section groups LOGG1 to LOGGR may include at least two of the first to $N^{th}$ logic sections LOG1 to LOGN described above. Particularly, the first to $R^{th}$ logic section groups LOGG1 to LOGGR may delay the comparison signals included each of the first to $R^{th}$ comparison group signals VAMP1<1:A> to VAMPR<1:A> by delay times that are differently set for the respective comparison group signals VAMP1<1:A> to VAMPR<1:A> to generate the first to $R^{th}$ logic group signals VAMP'<1:A> to VAMPR'<1:A>.

Figure 10:
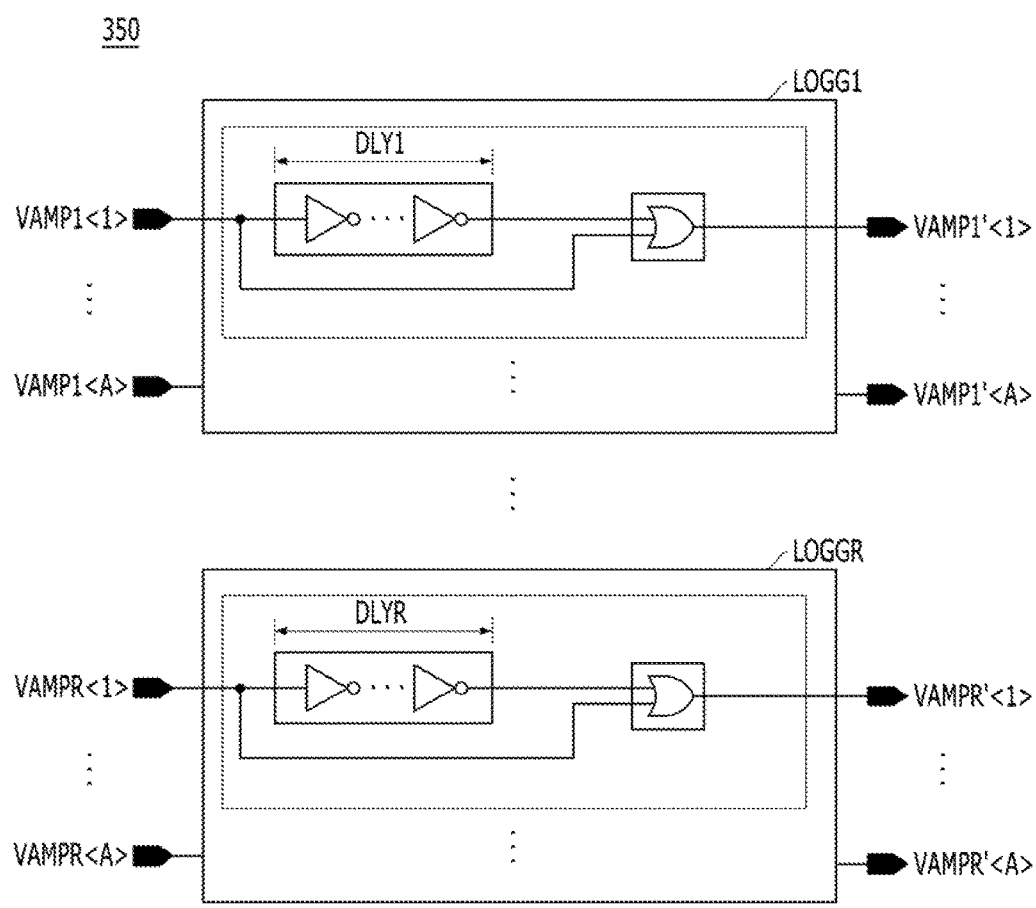
FIG. 10 is a detailed diagram of a logic block shown in FIG. 9.

FIG. 10 is a detailed diagram of the logic block 350 shown in FIG. 9.

Referring to FIG. 10, each of the first to $R^{th}$ logic section groups LOGG1 to LOGGR may include first to $A^{th}$ logic units. For example, the first to $A^{th}$ logic units included in the first logic section group LOGG1 may generate first to $A^{th}$ logic signals included in the first logic group signals VAMP1'<1:A> based on first to $A^{th}$ comparison signals included in the first comparison group signals VAMP1<1:A>, and the first to $A^{th}$ logic units included in the $R^{th}$ logic section group LOGGR may generate first to $A^{th}$ logic signals included in the $R^{th}$ logic group signals VAMPR'<1:A> based on first to $A^{th}$ comparison signals included in the $R^{th}$ comparison group signals VAMPR<1:A>. Since the first to $A^{th}$ logic units may have substantially the same structure as the first logic unit LOG1 described above, detailed description of the first to $A^{th}$ logic units will be omitted. The first logic section group LOGG1 may delay deactivation edges of the first to $A^{th}$ comparison signals included in the first comparison group signals VAMP1<1:A> by a first delay time DLY1 to generate the first to $A^{th}$ logic signals included in the first logic signals VAMP1'<1:A>, and the $R^{th}$ logic section group LOGGR may delay deactivation edges of the first to $A^{th}$ comparison signals included in the $R^{th}$ comparison group signals VAMPR<1:A> by an $R^{th}$ delay time DLYR to generate the first to $A^{th}$ logic signals included in the $R^{th}$ logic group signals VAMPR'<1:A>. That is, the same delay is reflected into logic sections included in the same logic section, and the delay times are differently set by groups.

Since an operation of the image sensing device 300 is similar to an operation of the image sensing device 200 described above, detailed descriptions of the operation of the image sensing device 300 will be omitted (refer to FIG. 7). Hereinafter, an operation related to the logic block 350, which is different from the operation described in the previous embodiment of the present invention, will be described.

Figure 11:
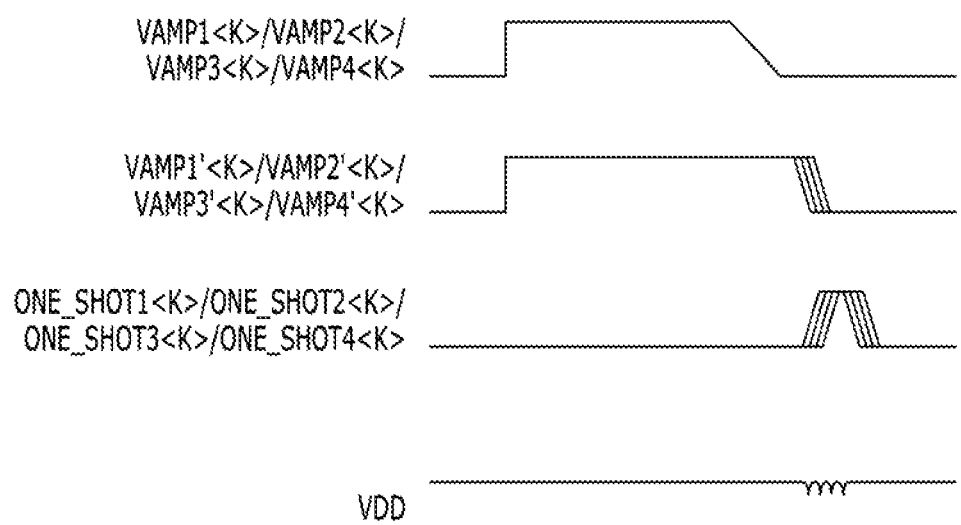
FIG. 11 is a timing diagram illustrating an operation of the image sensing device shown in FIG. 9.

FIG. 11 is a timing diagram illustrating an operation of the image sensing device 300 shown in FIG. 9. For the sake of convenience in description, it may be seen that FIG. 11 shows only some the signals.

Referring to FIG. 11, when a $K^{th}$ pixel signal VPX1<K> among the first pixel group signals VPX1<1:A> a $K^{th}$ pixel signal VPX2<K> among the second pixel group signals VPX2<1:A>, a $K^{th}$ pixel signal VPX3<K> among the third pixel group signals VPX3<1:A>, and a $K^{th}$ pixel signal VPX4<K> among the fourth pixel group signals VPX4<1:A> have a voltage level corresponding to the same incident light, decision timings of $K^{th}$ comparison signals VAMP1<K>, VAMP2<K>, VAMP3<K> and VAMP4<K> corresponding to the $K^{th}$ pixel signals VPX1<K>, VPX2<K>, VPX3<K> and VPX4<K> may be the same. Here, 'K' denote an arbitrary number. A deactivation edge of each of the $K^{th}$ pixel signals VPX1<K>, VPX2<K>, VPX3<K> and VPX4<K> may be driven to have the first slew rate. The first slew rate may be determined by respective differential amplification units included in the comparison block 340. The respective differential amplification units may be an analog circuit, and the first slew rate may be determined depending on an operational characteristic of the respective differential amplification units.

The first logic section group LOGG1 may generate a $K^{th}$ logic signal VAMP1'<K> deactivated at a decision timing after the first delay time DLY1 from a decision timing of the $K^{th}$ pixel signal VPX1<K>, and the second logic section group LOGG2 may generate a $K^{th}$ logic signal VAMP2'<K> deactivated at a decision timing after the second delay time DLY2 from a decision timing of the $K^{th}$ pixel signal VPX2<K>, and the third logic section group LOGG3 may generate a $K^{th}$ logic signal VAMP3'<K> deactivated at a decision timing after a third delay time DLY3 from a decision timing of the $K^{th}$ pixel signal VPX3<K>, and the fourth logic section group LOGG4 may generate a $K^{th}$ logic signal VAMP4'<K> deactivated at a decision timing after a fourth delay time DLY4 from a decision timing of the $K^{th}$ pixel signal VPX4<K>. A deactivation edge of each of the $K^{th}$ logic signals VAMP1'<K>, VAMP2'<K>, VAMP3'<K> and VAMP4'<K> may be driven to have the second slew rate that is greater than the first slew rate. Each of the first to fourth logic section groups LOGG1, LOGG2, LOGG3 and LOGG4 may be a digital circuit, and the second slew rate may be determined depending on an operational characteristic of the respective logic section groups LOGG1, LOGG2 LOGG3 and LOGG4.

The first storing section group LATG1 may generate a $K^{th}$ latch control signal ONE_SHOT1<K> corresponding to a decision timing of the $K^{th}$ logic signal VAMP1'<K> and latch count signal CNT<1:M> in response to the $K^{th}$ latch control signal ONE_SHOT1<K>. The second storing section group LATG2 may generate a $K^{th}$ latch control signal ONE_SHOT2<K> corresponding to a decision timing of the $K^{th}$ logic signal VAMP2'<K> and latch the count signal CNT<1:M> in response to the $K^{th}$ latch control signal ONE_SHOT2<K>. The third storing section group LATG3 may generate a $K^{th}$ latch control signal ONE_SHOT3<K> corresponding to a decision timing of the $K^{th}$ logic signal VAMP3'<K> and latch the count signal CNT<1:M> in response to the $K^{th}$ latch control signal ONE_SHOT3<K>. The fourth storing section group LATG4 may generate a $K^{th}$ latch control signal ONE_SHOT4<K> corresponding to a decision timing of the $K^{th}$ logic signal VAMP4'<K> and latch the count signal CNT<1:M> in response to the $K^{th}$ latch control signal ONE_SHOT4<K>. The first to fourth storing section groups LATG1, LATG2, LATG3 and LATG4 may sequentially operate, hence a voltage drop of a power source voltage VDD, which is a source voltage of the first to fourth storing section groups LATG1, LATG2, LATG3 and LATG4, may be dispersed.

Hence, another advantage of the present invention is that a more stable operation may be secured by dispersing a voltage drop of the power source voltage.

In accordance with embodiments of the present invention, an improved image sensing device is provided having enhanced operational reliability by minimizing the influence of a voltage drop in the power source voltage.

While the present invention has been described with respect to specific embodiments, the embodiments are not intended to limit the scope of the present invention. The present invention may be achieved in various ways through substitution, change, and modification, by those skilled in the art without departing from the spirit and/or scope of the present invention as defined by the following claims.

What is claimed is:

1. An image sensing device, comprising:
   a pixel array suitable for generating a plurality of pixel signals corresponding to incident light;
   a comparison block suitable for comparing the pixel signals with a ramp signal to generate a plurality of comparison signals;
   a logic block suitable for adjusting slew rates of the respective comparison signals through a logic operation to generate a plurality of logic signals;
   a global count block suitable for generating a global count signal; and
   a storing block suitable for storing counted values of the global count signal based on the logic signals received from the logic block, and
   wherein the logic block is coupled between the comparison block and the storing block.

2. The image sensing device of claim 1, wherein the comparison block and the storing block use the same source voltage.

3. The image sensing device of claim 1, wherein the logic block delays deactivation edges of the comparison signals.

4. The image sensing device of claim 1, wherein the logic block includes a plurality of logic sections each comprising:
   a first logic unit suitable for delaying a corresponding comparison signal to generate a corresponding delayed signal; and
   a second logic unit suitable for performing a logic operation on the corresponding comparison signal and the corresponding delayed signal to generate a corresponding logic signal.

5. The image sensing device of claim 1, wherein the storing block includes a plurality of logic sections each comprising:
   a latch control unit suitable for generating a corresponding latch control signal based on a corresponding logic signal; and
   a latch unit suitable for latching a corresponding count signal based on the corresponding latch control signal.

6. The image sensing device of claim 1, wherein at least two of the pixel signals have a voltage level corresponding to the same incident light during a unit row time.

7. The image sensing device of claim 1, wherein at least two of the pixel signals have a voltage level that falls within the same color range during a unit row time.

8. A method for driving an image sensing device, comprising:
   generating a plurality of comparison signals driven to have a first slew rate, based on a plurality of pixel signals and a ramp signal;
   generating a plurality of logic signals driven to have a second slew rate through a logic operation based on the comparison signals;
   generating a global count signal; and
   storing counted values of the global count signal based on the logic signals, and
   wherein the second slew rate is greater than the first slew rate.

9. The method of claim 8, wherein the generating of the comparison signals and the storing of counted values of the global count signal are carried out using the same source voltage.

10. The method of claim 8, wherein the generating of the logic signals includes delaying deactivation edges of the comparison signals to generate the logic signals.

11. The method of claim 8, wherein the generating of the logic signals includes:
   generating a plurality of delayed signals by delaying each of the comparison signals by the same delay time; and
   generating the logic signals by performing a logic operation on each of the comparison signals and delayed signals.

12. The method of claim 8, wherein at least two of the pixel signals have a voltage level corresponding to the same incident light during a unit row time.

13. The method of claim 8, wherein at least two of the pixel signals have a voltage level that falls within the same color range during a unit row time.

* * * * *